United States Patent [19]

Hansma et al.

[11] Patent Number: 4,566,023

[45] Date of Patent: Jan. 21, 1986

[54] SQUEEZABLE ELECTRON TUNNELLING JUNCTION

[75] Inventors: Paul K. Hansma; John M. Moreland, both of Goleta; Sam Alexander, Santa Barbara, all of Calif.

[73] Assignee: The Regents of the University of California, Berkeley, Calif.

[21] Appl. No.: 522,870

[22] Filed: Aug. 12, 1983

[51] Int. Cl.⁴ .......................................... H01L 29/84
[52] U.S. Cl. .......................................... 357/26; 357/6; 73/763
[58] Field of Search ....................... 357/6, 26; 73/763

[56] References Cited
U.S. PATENT DOCUMENTS

| | | | |
|---|---|---|---|
| 3,242,061 | 3/1966 | Armstrong | 204/143 |
| 3,491,588 | 1/1970 | Yerman | |
| 3,713,909 | 1/1973 | Rosevear et al. | 148/179 |
| 3,790,870 | 2/1974 | Mitchell | 357/26 |
| 3,872,490 | 3/1975 | Higashi | 357/26 |
| 4,011,577 | 3/1977 | Tanimura et al. | 357/26 |
| 4,019,197 | 4/1977 | Lohnstroh et al. | 357/23 |

OTHER PUBLICATIONS

Jaklevic et al., *Phys. Rev. Lett.*, vol. 17, No. 22, Nov. 22, 1966, pp. 1139 et seq.
Kikuchi et al., *Solid State Comm.*, vol. 7, 1969, pp. 463 et seq.

*Primary Examiner*—Martin H. Edlow
*Attorney, Agent, or Firm*—Poms, Smith, Lande & Rose

[57] ABSTRACT

A mechanically adjustable tunnelling junction includes two electrodes defining a gap supported on substrates. Spacers maintain the electrodes in spaced apart relation. At least one of substrates is mechanically deformable, whereby the application of an external force to the substrates decreases the gap to the range where tunnelling will occur.

8 Claims, 11 Drawing Figures

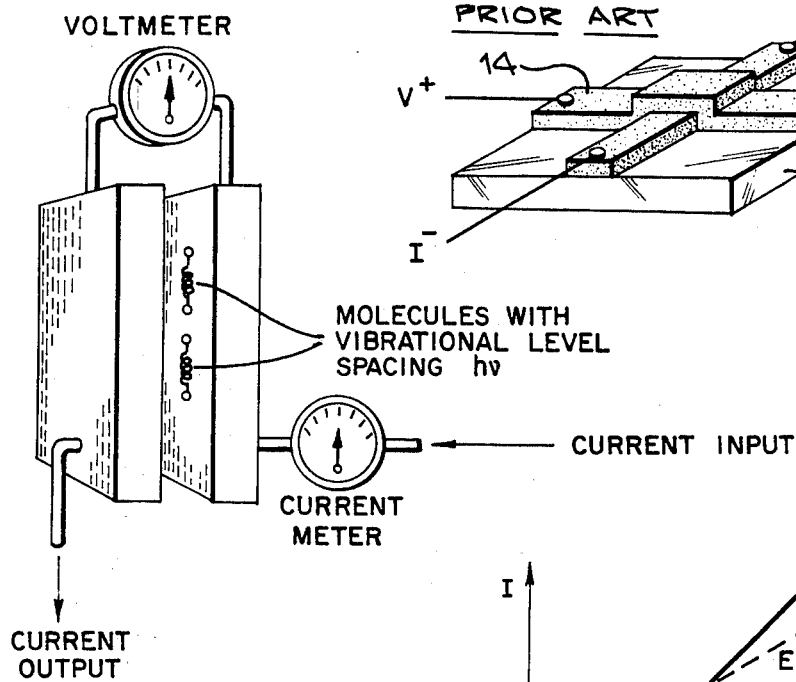
Fig. 1.
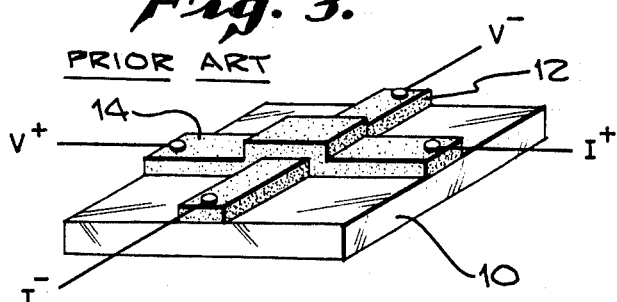
Fig. 3. PRIOR ART
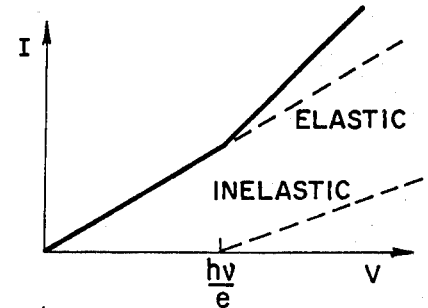
Fig. 2.ᵃ
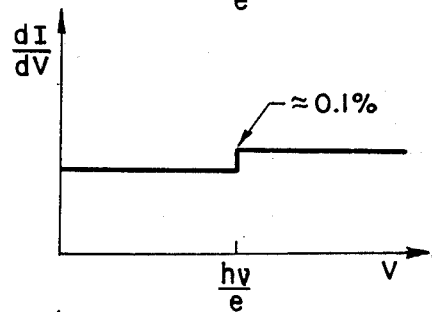
Fig. 2.ᵇ
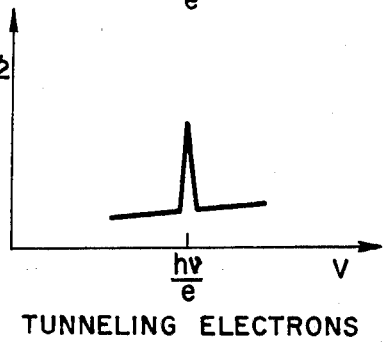
Fig. 2.ᶜ
TUNNELING ELECTRONS

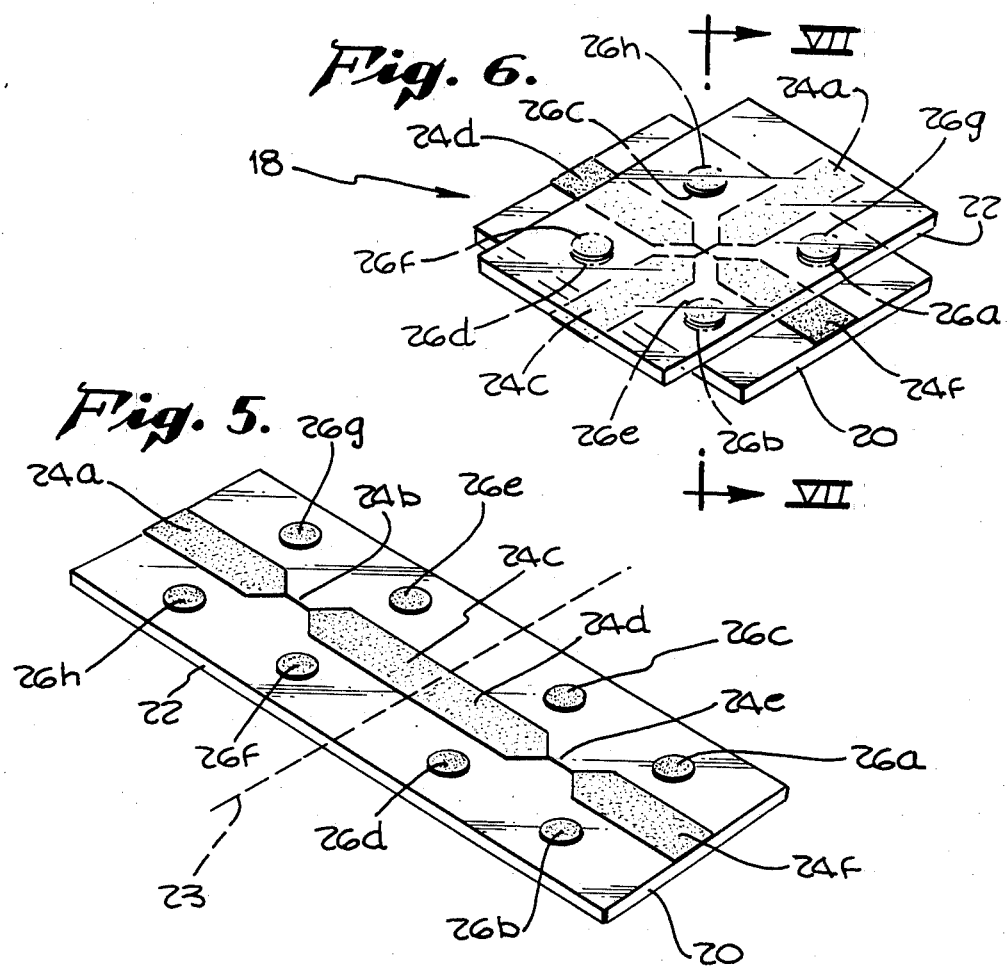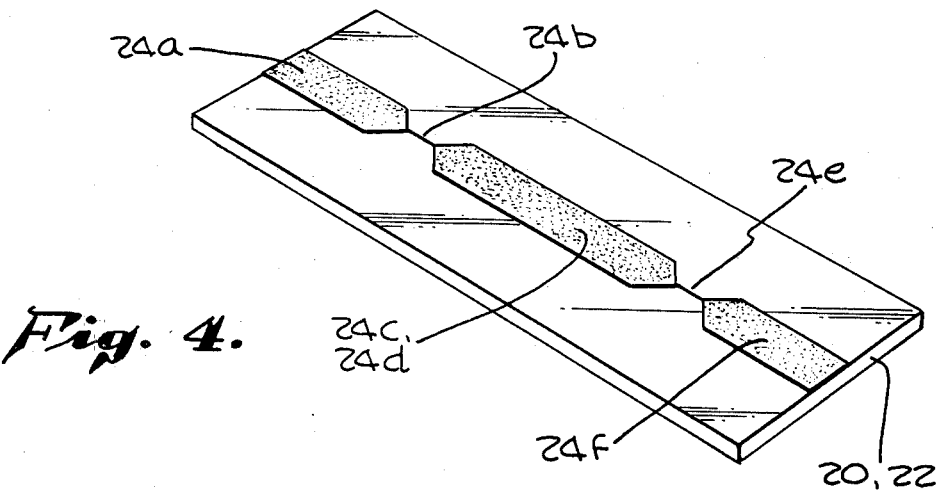

SQUEEZABLE ELECTRON TUNNELLING JUNCTION

This invention was made with Government support under Grant No. N00014-78-C-0011 awarded by the Office of Naval Research and Grant No. DMR79-25430 by the National Science Foundation. The Government therefore has certain rights in this invention.

FIELD OF THE INVENTION

The present invention relates generally to tunnelling spectroscopy, and relates specifically to electron tunnelling junctions with mechanically-adjusted artificial barriers.

BACKGROUND OF THE INVENTION

Tunnelling spectroscopy is a sensitive technique for measuring the vibrational spectra of molecules, and is a powerful way of identifying molecules and molecular fragments. Since a functional group, e.g. —$CH_3$, has roughly the same vibrational frequencies wherever it appears in a molecule, researchers can deduce the presence or absence of —$CH_3$ by the presence or absence of vibrations at its characteristic frequencies. From this knowledge of the presence or absence of functional groups, together with whatever other information is available, researchers can guess the structure of their unknown molecules. After they guess, they can use vibrational spectroscopy to see if they were right or wrong. They do this by comparing the vibrational spectrum of their unknown molecule to the vibrational spectrum of what they guess it is. There are many excellent, extensive collections of vibrational spectra for use in this comparison. If the spectrum of the guessed molecule is not in an accessible collection, the researcher consult the literature or measure it himself.

Tunnelling spectroscopy has a unique combination of spectral range, sensitivity, resolution, and selection rules. It is especially suited to the vibrational spectroscopy of adsorbed monolayers on surfaces.

FIG. 1 shows an idealized view of a tunnel junction. In this junction, current is measured as a function of voltage. Two components are found: a steadily increasing current due to elastic electron tunnelling and a current, which has a threshold voltage $h\nu/e$ and increases steadily thereafter, due to inelastic electron tunnelling. This threshold is set by the requirement that electrons must give up an energy $h\nu$ to excite the molecular vibration. Since their tunnelling energy is $eV$, the requirement exists that $eV$ is approximately greater than or equal to $h\nu$.

FIGS. 2a–c show the total current I, which is the sum of the current through the elastic and inelastic tunnelling channels. It has a kink at $V=h\nu/e$ (FIG. 2a), which becomes a step in $dI/dV$ versus V (FIG. 2b), and a peak in $d^2I/dV^2$ (FIG. 2c). A plot of $d^2I/dV^2$ versus V is referred to as a tunnelling spectrum.

Accordingly, a tunnelling spectrum reveals the vibrational energies of molecules included between two electrodes, since a vibrational energy of $h\nu$ results in a peak at $V=h\nu/e$. A real tunnelling spectrum has many peaks since the typical molecules that are studied have many vibrational modes.

The most serious limitation of tunnelling spectroscopy is that it can only be performed with tunnel junctions. A typical prior art "oxide barrier" tunnel junction is shown in FIG. 3. Such a junction consists of a rigid substrate 10 having evaporated thereon a bottom electrode 12, typically of aluminum. Bottom electrode 12 is then oxidized and doped in a manner to obtain a monolayer of chemisorbed molecules, which are the molecules to be studied. Last, a top electrode, typically lead, is evaporated over the bottom electrode 12 and onto the substrate, so as to "sandwich" the doped molecules between the two electrodes. The vibrational spectra is then obtained.

The prior art "oxide barrier" junctions discussed above suffer from several inherent limitations. First, the bottom electrode can only be a metal that forms a thin, pinhole-free oxide of high dielectric strength. Second, the junction cannot, in general, be adjusted after it is made. Third, for tunnelling spectroscopy, the unknown must be sandwiched between the oxide and the top electrode.

It has also been recognized that, to be able to measure a tunnelling current, the electrodes must be spaced no more than 100 angstroms apart, which precluded the use, in the prior art oxide barrier junctions of an air or a vacuum between the electrodes due to problems of vibration. No prior art junction has disclosed a mechanically-adjusted metal-insulator-metal junction. Such a junction would overcome all of the limitations mentioned above for oxide barrier junctions.

Accordingly, it is the principal object of the present invention to mechanically adjust an artificial barrier junction.

Another object of the present invention is to utilize a mechanically adjustable artificial barrier junction with a vacuum, gas, or liquid.

SUMMARY OF THE INVENTION

The present invention, in a broad aspect, provides a squeezable electron tunnelling junction including a pair of electrodes defining an insulating gap, spacers for maintaining the gap, and at least one flexible substrate supporting one of the electrodes and spacers and responsive to an externally applied force, for allowing the gap to be narrowed under the application of the force to a point where tunnelling occurs.

In accordance with various features of the invention, the flexible substrate can comprise a semi-rigid glass substrate with a planar surface. Two such substrates can be used, with the substrates being disposed with the planar surfaces in facing relation. The electrodes can be formed by thin-film strips of metallic material evaporated on such substrates, with the electrodes being disposed so as to cross. The spacers include a plurality of thin-film discrete spacers of a thickness greater than that of the electrodes, deposited on each of the substrates in mutually contacting relation. In this manner, the crossed electrodes form a gap of approximately 10,000 angstroms wide prior to the application of the external force. Under the application of the force, the gap may be narrowed to less than 100 angstroms.

Furthermore, the junction of the present invention can be used with vacuum, gas, or liquid, thereby precluding electron tunnelling on the surfaces of bulk materials such as single crystal faces without changing their chemical characteristics by forming oxide tunnelling barriers.

Other objects, features, and advantages of the present invention will become apparent from a consideration of the following detailed description and the accompanying drawings.

BRIEF DESCRIPTION OF THE DRAWINGS

FIG. 1 shows a schematic view of a tunnelling junction;

FIG. 2 shows the current versus voltage characteristic of the schematic diagram shown in FIG. 1;

FIG. 3 shows a paior art oxide barrier tunnelling junction;

FIG. 4 shows the deposited electrode portions of the squeezable electron tunnelling junction according to the present invention;

FIG. 5 shows the tunnelling junction after depositation of the spacer portions thereof;

FIG. 6 shows the assembled squeezable electrode tunnelling junction according to the present invention;

DETAILED DESCRIPTION

Figures 7, 8:
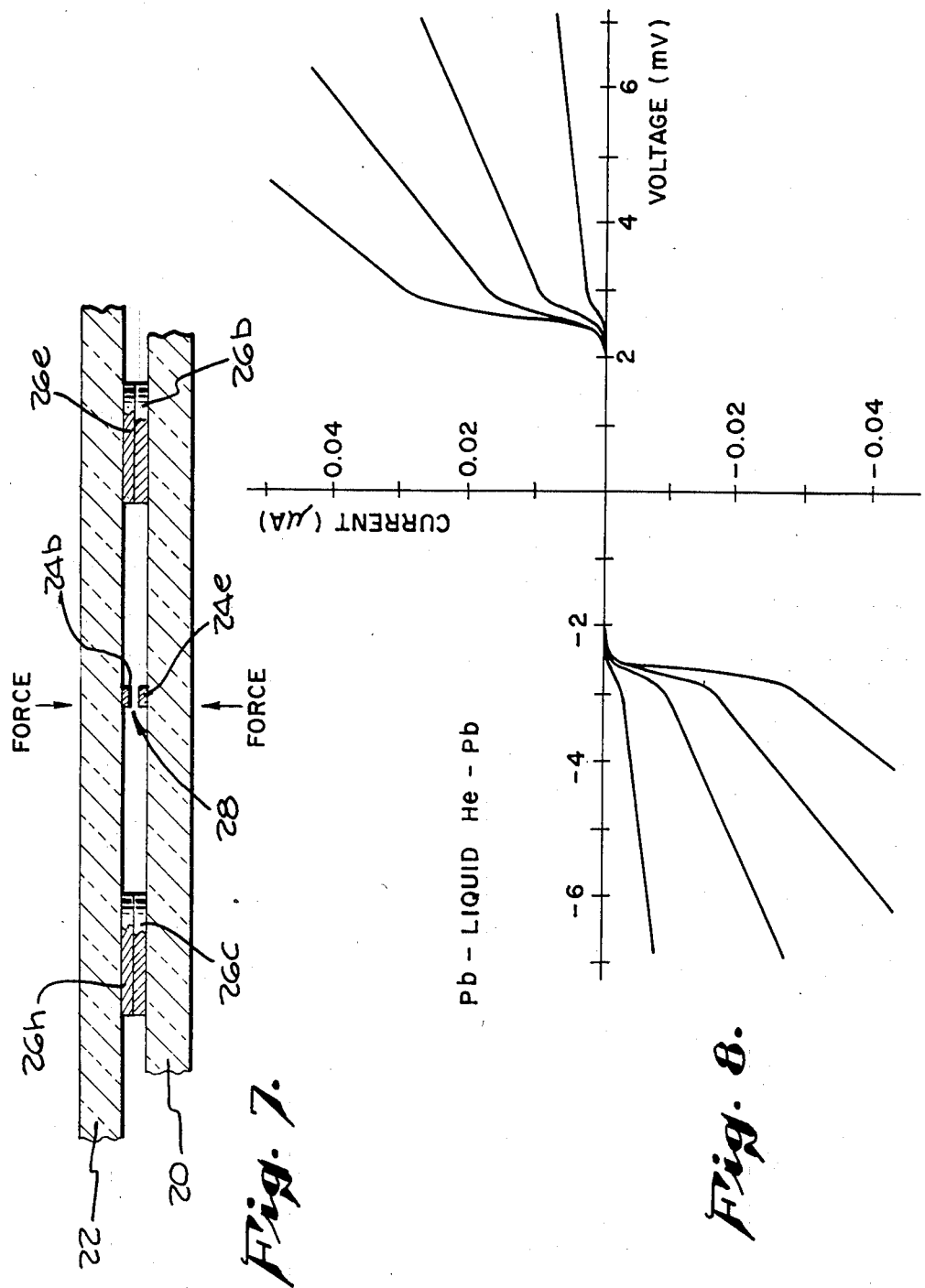
FIG. 7 shows a cross-sectional view, taken through the plane VII—VII of FIG. 6 of a tunnelling junction according to the present invention.
FIG. 8 shows the current-voltage characteristics obtained at 1.2 degrees K. in liquid helium for a tunnel junction according to the present invention that utilizes superconducting lead electrodes with different applied forces.

Referring more particularly to the drawings, a squeezable electron tunnelling junction 18 according to the present invention is shown in perspective view in FIG. 6. The structure of the tunnelling junction 18 can be best understood by a description of the process by which the junction is constructed, as reflected in FIGS. 4 and 5. The junction 18 is constructed upon a glass substrate 20,22 as shown in FIG. 4. One millimeter thick glass microscope slides can be used for this purpose. Onto the slide 20,22 is deposited a continuous electrode 24. The deposition occurs by evaporating metals through masks onto the glass substrates at a pressure of $10^{-5}$ torr. The electrode so formed has several wide portions 24a, 24c-d, and 24f connected by two narrow portions 24b and 24e. These two portions 24b and 24e have a width of approximately 50 microns and are used to form the gap as discussed below.

After the electrodes are formed, spacers 26a through 26h are deposited onto the glass substrate 20,22. These spacers are generally 0.2 to 1.0 microns thick and are thicker than the thickness of the electrode 24, which is generally less than 1 micron. The spacers 26 are deposited in a manner similar to the electrode 24, although different deposition techniques could be used for both components.

After the spacers 22 are deposited, the substrate 20,22 is scribed and broken at its middle portion 23, thereby producing one substrate 20 with four spacers 26a-26d and a continuous electrode 24d, 24e, 24f, and a second substrate 22 with its set of spacers 26e-26h and its electrode 24a, 24b, 24c. One substrate 22 with its electrode 24 and spacers 26 is then crossed over and turned toward the other substrate 20 with its electrodes 24 and spacer 26 such that the electrodes cross and the spacers meet, as reflected in FIG. 6.

The purpose of having the electrodes 24b and 24e of a width of 50 microns at the crossing point is to ensure a nearly constant gap over the area of intersection. With this narrow an electrode, the variation of the mean distance between the electrode surfaces can be less than 0.1 angstroms in the region of intersection.

A cross-sectional view of the assembled junction 18 is shown in FIG. 7. The narrow portions of the electrodes 24b and 24e are spaced apart and define a tunnelling gap 28. The mutually contacting spacers, in this case pairs 26c-26h and 26a-26g maintain the electrodes in spaced-apart relation. It is in this junction 28 defined by the thin-film and narrow electrodes 24b and 24e in which a vacuum, gas, liquid or other material is inserted to obtain a vibrational spectra.

The mechanical adjustment of the junction 18 is done by applying an external force to the upper and lower substrates 22 and 20 as reflected in FIG. 7. Prior to the application of any force, the gap 28 is on the order of 10,000 angstroms. This zero force gap is set by the thickness of the evaporated spacer pads 26. When a mechanical force is applied to the substrates 22 and 20, the substrates mechanically deform to decrease the gap to the range required for tunnelling which, as mentioned, is less than 100 angstroms. These forces can be applied with a spring loaded micrometer and/or a precision electromagnet. With the precision electromagnet, force stability better than one part in $10^6$ can be achieved. This is sufficient to control the average spacing between the thin films to the order of 0.01 angstroms.

It should be emphasized that the films forming the electrodes and spacers 24 and 26, as well as the substrates 20 and 22 themselves do not need to be perfectly flat. Tunnelling will take place whenever the gap 28 is locally small. This may be from high points on one film to high points on the other. For most applications, the current does not need to be uniform over the area of the junction.

It should be emphasized that, while two flexible substrates have been illustrated and described, only one flexible substrate need be provided in order to fall within the scope of this invention. For example, a tunnelling gap could be formed between the face of a large conducting bulk sample such as a silicon wafer, which may or may not be flexible and a flexible substrate, with an electrode, supported on spacers above the sample. The electrode can be, for example, an idium plug inserted into the substrate, and/or the bulk sample.

FIG. 8 shows the measured current-voltage characteristics obtained at 1.2 degrees K. for a junction according to the present invention utilizing lead electrodes with liquid helium in the barrier. The energy gap around zero bias with $2\Delta=2.8$ meV, the appropriate value to electron tunnelling between superconducting lead electrodes. The normal tunnelling resistance (V greater than 2.8 meV) was changed from 1M ohms to 100K ohms by applying additional force. Assuming a barrier height of 4 eV, and a junction area of approximately 2500 square microns and an idealized parallel plane geometry, this resistance change corresponds to a gap change from 1.2 to 1.1 nm.

Figure 9:
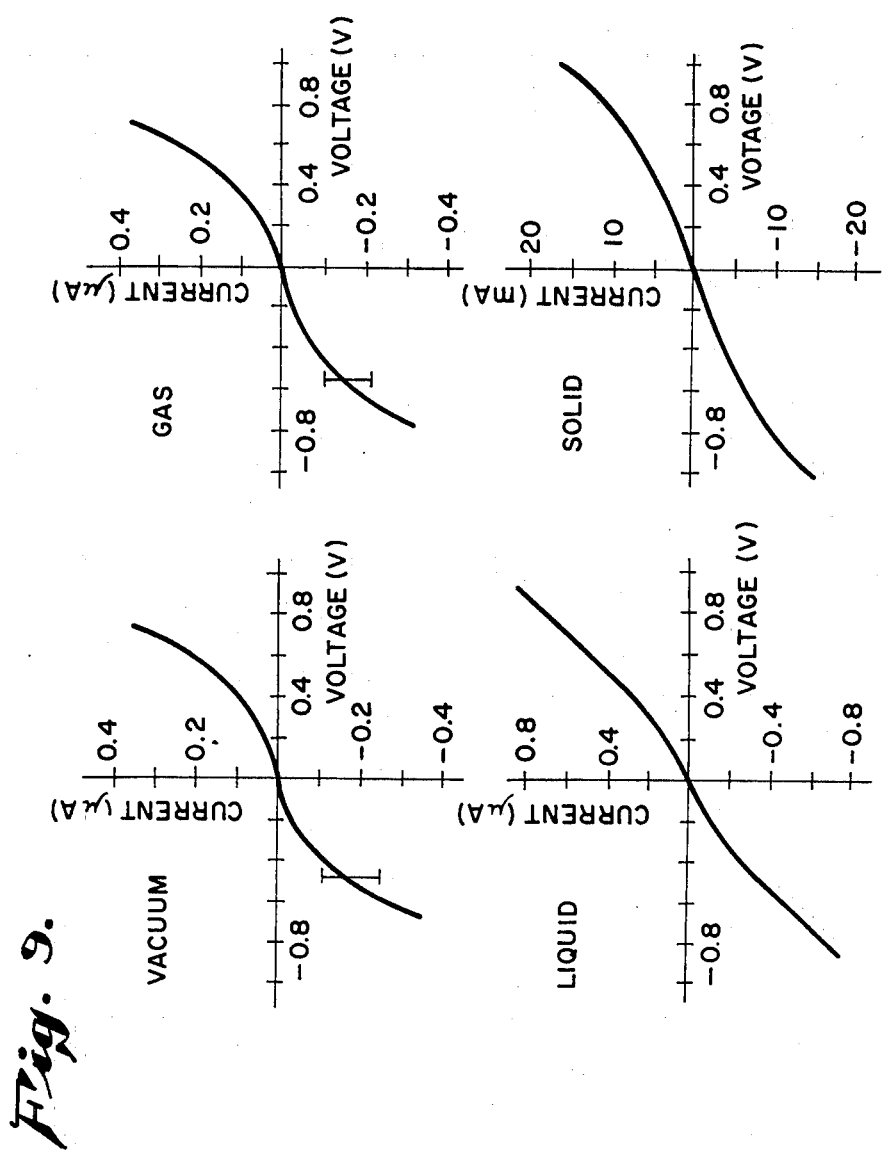
FIG. 9 shows current-voltage curves obtained at room temperature for a tunnelling junction according to the present invention utilizing silver electrodes and various materials in the gap.

FIG. 9 demonstrates the versatility of junctions according to the present invention by presenting current-voltage curves obtained at room temperature for junctions utilizing silver electrodes evaporated on glass microscope slides with various materials in the gap. The "vacuum" curve was obtained when a junction was adjusted in a sorption pumped vacuum chamber at a pressure of 5 times $10^{-3}$ Pa. The chamber was then vented to air to obtain the "gas" curve. The "liquid"

and "solid" curves show, respectively, the results for microscope immersion oil and napthalene in the gap.

The trend is for stability against vibration to increase with the viscosity of the material in the gap. The napthalene barrier was allowed to solidify after it was properly adjusted in the liquid state and proved to be most stable. Its resistance could be decreased by a factor of 100 with an additional 50N of applied force and was stable to 0.1% over time scales of minutes.

As seen from the foregoing, this invention allows the use of a precision controlled force and the natural springiness of a substrate to set a gap distance that is a fraction of the zero force gap set by the evaporated spacer pads 26.

The present invention has several applications: tunneling spectroscopy, light emitting junctions, semiconductor surface characterization, and superconductivity.

Regarding tunnelling spectroscopy, if the conductance of the tunnel junction is held constant with a feedback circuit that fine tunes the force applied to the sample, the second derivative can be monitored of the function of the voltage applied to the sample. As explained previously, this second derivative signal contains information about the vibrational spectra and electron excitation spectra of molecules within the tunnel junction. Such tunnelling spectra could reveal the adsorbed molecules on surfaces, the molecules exiting from a gas, liquid, or gel chromatograph or as selective gas or liquid stream monitors. The selectivity of the vibrational spectroscopy would allow the device to be tuned to the characteristic vibrations of specific molecules that it was desirable to select.

Regarding the light emitting junction, converting the energy of the tunnelling junction efficiently into visible light places constraints upon the type of tunnel junction that can be used. The flexibility of the present invention could be exploited with a production of tunnel junctions that would efficiently convert tunnelling energy into visible light. Regarding the characterization of semiconductor surfaces, if one of the electrodes is a semiconductor, the tunnelling spectrum will give information about surface contaminants and surface phonons of the semiconductor. At larger spacings, a capacitance versus voltage and conductance versus voltage curve gives information about surface stages on the semiconductor. Such information could be used to optimize surface quality.

Regarding superconductivity, tunnelling electrons provide more sensitive probes for the onset and mechanisms of the superconducting state. For example, a $(TMTSF)_2 ClO_4$ organic crystal has been incorporated into the present invention. Since this material does not form an oxide barrier, mechanically adjusted barriers are necessary for obtaining reliable information about the transition into the superconducting state.

In the foregoing description of the present invention, a preferred embodiment of the invention has been disclosed. It is to be understood that other mechanical and design variations fall within the scope of the present invention and thus the invention is not limited to the particular embodiment which has been set forth and discussed in detail herein.

What is claimed is:

1. A squeezable electron tunnelling junction comprising:
   flexible substrate means for providing two opposed supporting surfaces;
   electrode means, disposed on said substrate means, for defining a gap between said surfaces; and
   spacer means for maintaining said electrode means in spaced apart relation, whereby an external force can be applied to said substrate means to decrease said gap to a point where tunnelling will occur.

2. A junction as defined in claim 1, wherein:
   said substrate means comprises a pair of semi-rigid substrates each having at least one planar surface, with said planar surfaces being disposed in facing relation;
   said electrode means comprises an electrode on each of said substrates; and
   said spacer means comprises a plurality of thin film discrete spacers, each having a thickness greater than that of said electrodes, deposited on each of said substrates for mutual contact.

3. A junction as defined in claim 2, wherein:
   said substrates each comprise a thin sheet of glass material; and
   said electrodes and said spacers each comprise metallic material.

4. A junction as defined in claim 1, wherein:
   said gap between said surfaces is aproximately 10,000 angstroms wide prior to said application of said external force; and
   said gap between said surfaces may be narrowed under the application of said force to less than 100 angstroms.

5. A junction as defined in claim 2, wherein:
   said electrodes have a width of approximately 50 microns at said gap between said surfaces;
   said electrodes each have a thickness of less than one micron; and
   said spacers each have a thickness in the range of 0.2 to 1.0 microns.

6. A mechanically adjustable tunnelling junction comprising:
   first electrode means;
   second electrode means disposed in a gap-defining relation to said first electrode means;
   spacer means for maintaining said gap between said electrode means; and
   substrate means for supporting said electrode means and said spacer means and for transmitting an externally-applied mechanical force to said electrode means to urge said electrode means closer together to narrow said gap.

7. A junction as defined in claim 6, wherein:
   said substrate means comprises a pair of flexible substrates upon which said electrode means and said spacer means are deposited.

8. A squeezable electron tunnelling junction comprising:
   electrode means for defining an electron tunnelling gap;
   spacer means for maintaining said gap; and
   flexible substrate means, supporting said electrode means and said spacer means and responsive to an externally applied force, for allowing said gap to be narrowed under the application of said force.

* * * * *